(12) United States Patent
Moriyama

(10) Patent No.: US 12,713,960 B2
(45) Date of Patent: Aug. 18, 2026

(54) PAD METALLIZATION WITH OXIDE LAYER TO REDUCE DEFORMATION OF CONDUCTIVE FILMS

(71) Applicant: RENESAS ELECTRONICS CORPORATION, Tokyo (JP)

(72) Inventor: Takashi Moriyama, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 536 days.

(21) Appl. No.: 18/163,576

(22) Filed: Feb. 2, 2023

(65) Prior Publication Data

US 2023/0352430 A1 Nov. 2, 2023

(30) Foreign Application Priority Data

Apr. 4, 2022 (JP) ................................ 2022-062226

(51) Int. Cl.
*H01L 23/498* (2006.01)
*G11C 5/06* (2006.01)
(Continued)

(52) U.S. Cl.
CPC ......... *H10W 72/90* (2026.01); *H10W 72/019* (2026.01); *H10W 72/075* (2026.01);
(Continued)

(58) Field of Classification Search
CPC . H10W 72/90; H10W 72/019; H10W 72/075; H10W 72/50; H10W 72/5522;
(Continued)

(56) References Cited

U.S. PATENT DOCUMENTS 6,280,828 B1 * 8/2001 Nakatsuka ............ H05K 3/244 428/209
8,154,129 B2 4/2012 Okada et al.
(Continued)

FOREIGN PATENT DOCUMENTS

JP 2008-258499 A 10/2008
JP 2009-099669 A 5/2009
(Continued)

OTHER PUBLICATIONS

Office Action issued on Jun. 3, 2025 in the corresponding Japanese patent application No. 2022-062226, w/ English Translation.
(Continued)

*Primary Examiner* — Wael M Fahmy
*Assistant Examiner* — Aneesa Riaz Baig
(74) *Attorney, Agent, or Firm* — Rimon P.C.

(57) ABSTRACT

A pad electrode is formed in an uppermost wiring layer of a multilayer wiring layer formed on a semiconductor substrate. A dielectric film is formed to cover the pad electrode. An opening portion is formed in the dielectric film so as to reach the pad electrode. In the opening portion, a conductive film that is a part of a conductive layer is electrically connected to the pad electrode. On a side surface of the conductive film, an oxide layer in which a material contained in the conductive film is oxidized is formed. A width of the oxide layer is 200 nm or more.

10 Claims, 13 Drawing Sheets

(51) Int. Cl.

| | |
|---|---|
| ***H01L 21/768*** | (2006.01) |
| ***H01L 23/00*** | (2006.01) |
| ***H01L 23/495*** | (2006.01) |
| ***H10B 51/10*** | (2023.01) |
| ***H10B 51/20*** | (2023.01) |
| ***H10D 30/01*** | (2025.01) |
| ***H10D 30/47*** | (2025.01) |
| ***H10D 62/85*** | (2025.01) |
| ***H10D 64/64*** | (2025.01) |
| ***H10H 20/852*** | (2025.01) |
| ***H10H 20/857*** | (2025.01) |
| ***H10W 72/00*** | (2026.01) |
| ***H10W 72/20*** | (2026.01) |
| ***H10W 72/50*** | (2026.01) |
| ***H10W 72/59*** | (2026.01) |
| ***H10W 72/90*** | (2026.01) |

(52) U.S. Cl.

CPC ......... *H10W 72/222* (2026.01); *H10W 72/50* (2026.01); *H10W 72/01908* (2026.01); *H10W 72/5522* (2026.01); *H10W 72/5525* (2026.01); *H10W 72/59* (2026.01); *H10W 72/923* (2026.01); *H10W 72/952* (2026.01); *H10W 72/983* (2026.01)

(58) Field of Classification Search

CPC ............. H10W 72/5525; H10W 72/59; H10W 72/923; H10W 72/952; H10W 72/29; H10W 72/20; H10W 72/01257; H10W 72/934; H10W 72/9415; H10W 72/942; H10W 72/221; H10W 20/047–051; H10W 20/064–065; H10W 72/222; H10W 72/224; H10P 14/69215; H01L 23/49838; H01L 23/49822; H01L 23/49866; H01L 21/4853; H01L 21/4857; H01L 24/85; H01L 24/42–49; H01L 2224/04042; H01L 2224/80895; H01L 24/11; H01L 24/14–27; H01L 24/75; H01L 24/80; H01L 24/81; H01L 21/50; H01L 2021/60007; H01L 2021/60022; H01L 2224/11003; H01L 2224/11005; H01L 2224/11334; H01L 24/07–09; H01L 24/15–17; H01L 2224/3201–32014; H01L 2224/325–32507; H01L 2224/3301; H01L 2224/33505; H01L 21/02614; H01L 21/76855–76859; H01L 21/76886–76888

See application file for complete search history.

(56) References Cited

U.S. PATENT DOCUMENTS

| | | | | |
|---|---|---|---|---|
| 10,453,816 | B2 | 10/2019 | Tanaka et al. | |
| 10,490,517 | B2 | 11/2019 | Usami | |
| 11,121,106 | B2 | 9/2021 | Kuo et al. | |
| 2003/0006062 | A1* | 1/2003 | Stone | H01L 24/16 257/E23.021 |
| 2009/0149016 | A1* | 6/2009 | Park | H01L 24/13 257/E21.582 |
| 2009/0170246 | A1* | 7/2009 | Chatterjee | H01L 24/11 438/109 |
| 2009/0315175 | A1* | 12/2009 | Okada | H01L 24/06 257/737 |
| 2012/0306073 | A1* | 12/2012 | Yu | H01L 24/13 257/737 |
| 2014/0077359 | A1* | 3/2014 | Tsai | H01L 24/81 257/737 |
| 2014/0321032 | A1* | 10/2014 | Lazarus | B81C 1/00095 361/679.01 |
| 2016/0276369 | A1* | 9/2016 | Cao | H10D 64/62 |
| 2016/0300804 | A1* | 10/2016 | Omori | H01L 21/76852 |
| 2018/0053737 | A1* | 2/2018 | Ogawa | H01L 24/03 |
| 2018/0090461 | A1* | 3/2018 | Tanaka | H01L 23/3114 |
| 2020/0266168 | A1* | 8/2020 | Niwa | H01L 24/05 |
| 2020/0402949 | A1* | 12/2020 | Chu | H01L 24/73 |

FOREIGN PATENT DOCUMENTS

| | | | |
|---|---|---|---|
| JP | 2018-061018 | A | 4/2018 |
| JP | 2018-206938 | A | 12/2018 |
| TW | 202119509 | A | 5/2021 |
| WO | 2016/143557 | A1 | 9/2016 |

OTHER PUBLICATIONS

1 Office Action dated May 25, 2026, issued in Taiwanese Patent Application No. 112111428.

* cited by examiner

IL4
IL3
IL2
IL1
IL0
STI
SUB
WL
2Q
1Q
WL
M4
V3
M3
V2
M2
V1
M1
PG

WB
OPM
10
10
WB
OPM
IF1

PAD METALLIZATION WITH OXIDE LAYER TO REDUCE DEFORMATION OF CONDUCTIVE FILMS

CROSS-REFERENCE TO RELATED APPLICATIONS

The disclosure of Japanese Patent Application No. 2022-062226 filed on Apr. 4, 2022, including the specification, drawings and abstract is incorporated herein by reference in its entirety.

BACKGROUND

The present disclosure relates to a semiconductor device and a method of manufacturing the same and, for example, to a semiconductor device including a conductive layer formed on a pad electrode and a method of manufacturing the same.

In order to improve the reliability of semiconductor device, a conductive layer called an OPM (Over Pad Metal) electrode is formed on a pad electrode which is a part of the uppermost layer wiring in the multilayer wiring layer formed on a semiconductor substrate. An external connecting member such as a wire bonding is connected to the OPM electrode.

There are disclosed techniques listed below.

[Patent Document 1] Japanese Unexamined Patent Application Publication No. 2018-206938

For example, Patent Document 1 discloses a technique for forming a wiring by forming a conductive layer on a pad electrode by a plating method.

SUMMARY

In recent years, the space between the pad electrodes has been reduced for the purpose of ease of design, reduction in chip area, and the like. In addition, a conductive layer such as an OPM electrode formed on the pad electrode, or a wiring is also required to reduce the space between the conductive layers. Therefore, the insulating property between the conductive layers is deteriorated due to a residue of the conductive layer or electromigration, and a leakage current is easily generated. Therefore, there is a need for a technique for solving such a problem and improving the reliability of the semiconductor device.

Other objects and novel features will become apparent from the description of this specification and the accompanying drawings.

The typical ones of the embodiments disclosed in the present application will be briefly described as follows.

A semiconductor device according to one embodiment includes a multilayer wiring layer formed on a semiconductor substrate, a pad electrode formed in an uppermost wiring layer of the multilayer wiring layer, a dielectric film formed so as to cover the pad electrode, an opening portion formed in the dielectric film so as to reach the pad electrode, and a first conductive film electrically connected to the pad electrode in the opening portion. Here, an oxide layer is formed on a side surface of the first conductive film by oxidizing a material contained in the first conductive film, and a width of the oxide layer is 200 nm or more.

A manufacturing method of a semiconductor device according to one embodiment includes: (a) forming a multilayer wiring layer on a semiconductor substrate; (b) forming a dielectric layer so as to cover a pad electrode formed in an uppermost wiring layer of the multilayer wiring layer; (c) forming an opening portion in the dielectric film so as to reach the pad electrode; (d) forming a first conductive film on the pad electrode in the opening portion by a plating method; and (e) performing an oxidation treatment to the first conductive film and oxidizing a material contained in the first conductive film, thereby forming an oxide layer on a side surface of the first conductive film. Here, a width of the oxide layer is 200 nm or more.

According to one embodiment, the reliability of the semiconductor device can be improved.

DETAILED DESCRIPTION

Figure 1:
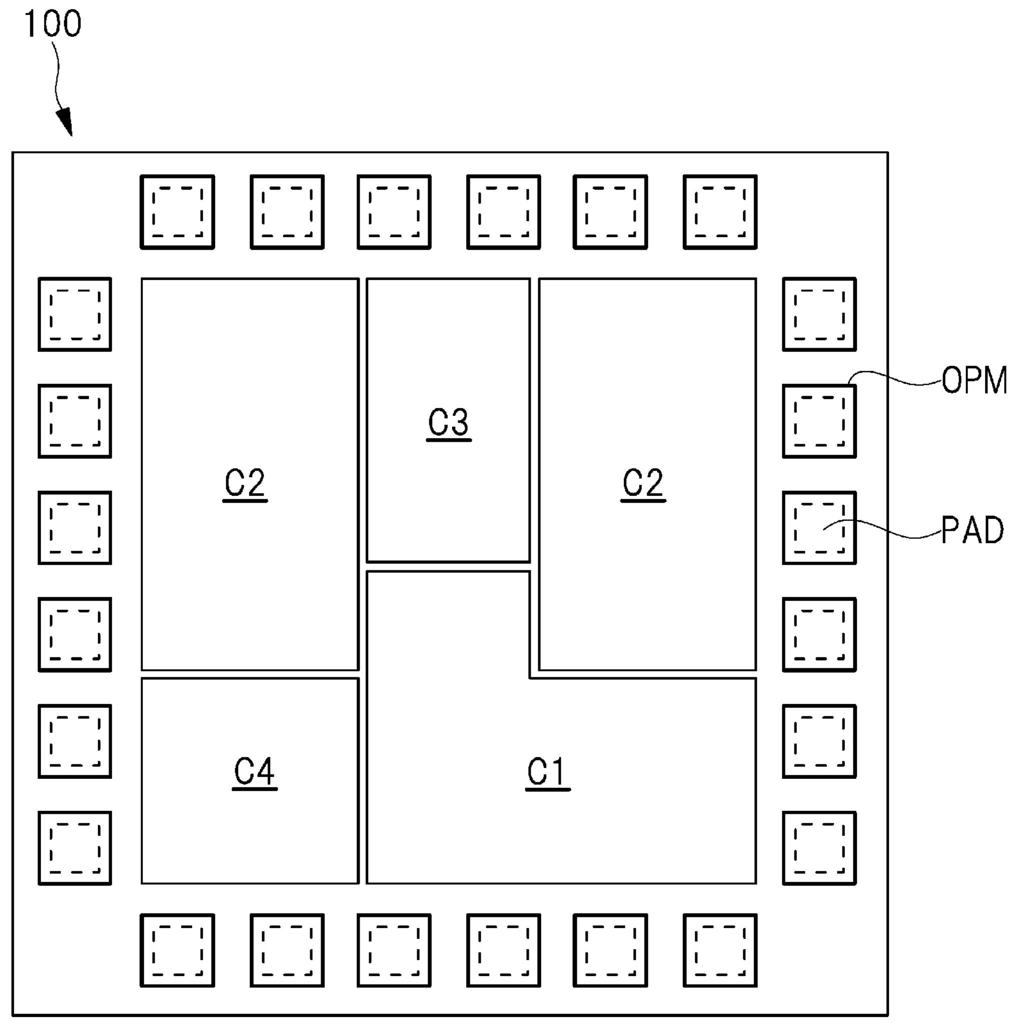
FIG. 1 is a plan view showing the semiconductor device in the first embodiment.

In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

First Embodiment

Structure of Semiconductor Device

A semiconductor device 100 in the first embodiment will be described below with reference to FIGS. 1 and 2. In the first embodiment, a case where the semiconductor device 100 is one semiconductor chip will be described, but the semiconductor device 100 may be a laminated structure with another semiconductor chip, or may be a semiconductor module in which a semiconductor chip is provided on a mounting substrate.

FIG. 1 is a plan view showing the semiconductor device 100. The semiconductor device 100 is, for example, an MCU (Memory Controller Unit) having a nonvolatile memory element such as a flash memory, and has a rectangular shape in plan view. FIG. 1 shows, as circuit regions C1 to C4, regions in which the semiconductor elements constituting the circuits used in each application are formed.

The circuit region C1 is, for example, a CPU (Central Processing Unit) and is a region in which a low withstand voltage MISFET (Metal Insulator Semiconductor Field Effect Transistor) that operates at a relatively low-voltage and high-speed is formed as a semiconductor element. The circuit region C2 is, for example, a nonvolatile memory cell, and a nonvolatile memory element such as a MONOS (Metal Oxide Nitride Oxide Silicon) memory is formed as a semiconductor element. The circuit region C3 is, for example, a SRAM (Static Random Access Memory), and a low withstand voltage MISFET having substantially the same configuration as that of the circuit region C1 is formed as a semiconductor element. The circuit region C4 is, for example, an analog circuit, and is a region in which a high withstand voltage MISFET having a withstand voltage higher than the low withstand voltage MISFET, a capacitor element, a resistor element, a bipolar transistor, and the like are formed as semiconductor elements.

A multilayer wiring layer is formed on the semiconductor substrate, and a pad electrode PAD is formed in the uppermost wiring layer of the multilayer wiring layer. The pad electrode PAD is electrically connected to the respective circuit region C1 to C4 via the multilayer wiring layer. The conductive layer OPM is formed on the pad electrode PAD and is electrically connected to the multilayer wiring layer via the pad electrode PAD. A plurality of such pad electrodes PAD and conductive layers OPM are formed in the semiconductor device 100.

Figure 2:
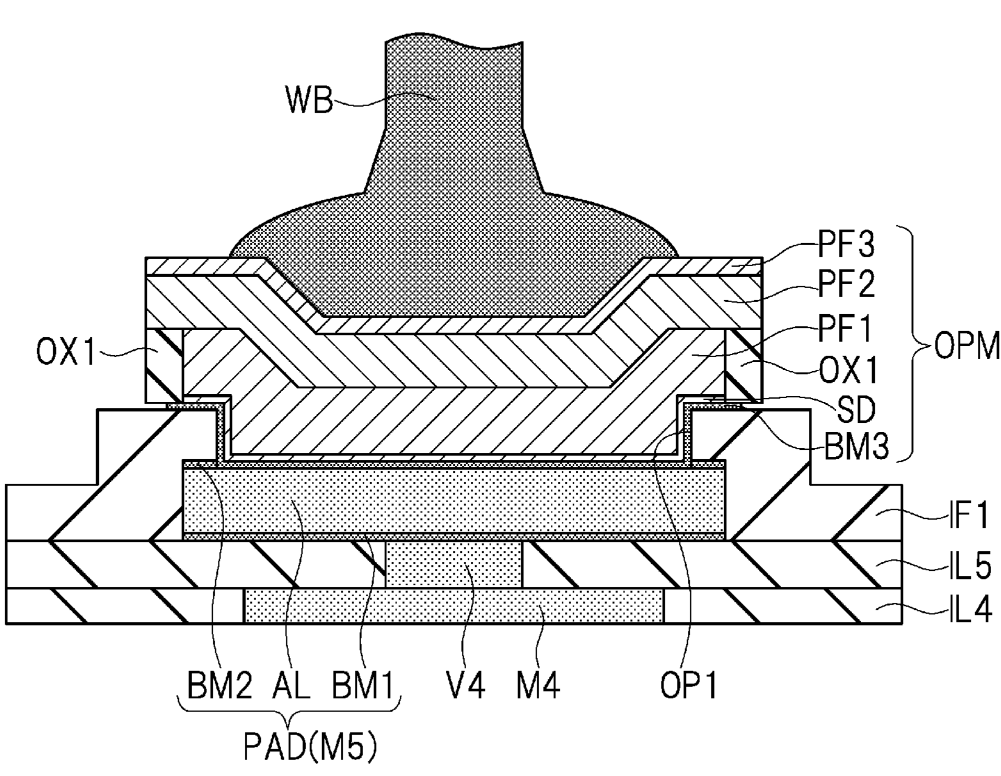
FIG. 2 is a cross-sectional view showing the semiconductor device in the first embodiment.

FIG. 2 is an enlarged cross-sectional view of the pad electrode PAD and the conductive layer OPM. As shown in FIG. 2, a fourth wiring M4 in a damascene structure is formed in the interlayer dielectric film IL4 on the semiconductor device 100. That is, the fourth wiring M4 is formed by burying a copper-based conductive film in the trench formed in the interlayer dielectric film IL4.

Note that since the main characteristic of the first embodiment is the structure of the conductive layer OPM, in FIG. 2, the fourth wiring M4 and the structure of the upper layer thereof are shown, and the structure of the lower layer than the fourth wiring M4 is not shown. The lower layer structure and its manufacturing method will be described in Manufacturing Method of Semiconductor Device described later with reference to FIG. 3.

An interlayer dielectric film IL5 is formed on the fourth wiring M4, and a via V4 is formed in the interlayer dielectric film IL5. The interlayer dielectric film IL5 is, for example, a silicon oxide film or a fluorine-doped silicon oxide film, and the via V4 is, for example, a tungsten-based conductive film.

A fifth wiring M5 is formed on the interlayer dielectric film IL5, and the fifth wiring M5 is electrically connected to the fourth wiring M4 via the via V4. The fifth wiring M5 is a plurality of wirings formed in the uppermost layer of the multilayer wiring layer, and a part of the plurality of wirings is used as the pad electrode PAD. The pad electrode PAD includes a barrier metal film BM1, a conductive film AL formed on the barrier metal film BM1, and a barrier metal film BM2 formed on the conductive film AL. The barrier metal, film BM1 and the barrier metal film BM2 are each a titanium nitride film or a laminated film of a titanium nitride film and a titanium film. The conductive film AL is an aluminum-based conductive film.

A dielectric film IF1 is formed on the interlayer dielectric film IL5 so as to cover the pad electrode PAD. The dielectric film IF1 is, for example, a silicon oxide film, a silicon nitride film, or a polyimide film, or a laminated film obtained by laminating these films as appropriate. The thickness of the dielectric film IF1 is, for example, 200 nm or more and 1000 nm or less. An opening portion OP1 is formed in the dielectric film IF1 so as to reach the pad electrode PAD. In addition, the barrier metal film BM2 is removed in the opening portion OP1.

The conductive layer OPM is formed on the dielectric film IF1 so as to bury the inside of the opening portion OP1, and is electrically connected to the pad electrode PAD. The conductive layer OPM is an OPM electrode structure. The conductive layer OPM includes a barrier metal film BM3, a seed layer SD formed on the barrier metal film BM3, a conductive film PF1 formed on the seed layer SD, a conductive film PF2 formed on the conductive film PF1, and a conductive film PF3 formed on the conductive film PF2.

The conductive film PF1 and the seed layer SD are made of, for example, copper-based materials. The seed layer SD is finally incorporated into and integrated with the conductive film PF1, but these are shown separately here for ease of understanding. The barrier metal film BM3 is, for example, a titanium film, a tantalum film, or a chromium film, and has a function of preventing the conductive film PF1 (copper) from diffusing. Further, the barrier metal film BM3 may be a single-layer film made of the above-described material, but may be a laminated film in which the single-layer film and a nitride film such as a titanium nitride film or a tantalum nitride film are laminated.

The conductive film PF2 is made of a material that differs from the conductive film PF1, and is made of, for example, a nickel-based material. The conductive film PF3 is made of a material other than the conductive film PF1 and the conductive film PF2, and is made of, for example, a gold-based material. The conductive film PF3 is a film provided to enhance adhesion to the wire bonding WB and prevent the conductive layer OPM from being oxidized. The wire bonding WB is connected to the conductive film PF3 and is made of, for example, a copper-based or gold-based material.

It is also conceivable to use a solder bump electrode instead of a wire bonding WB as the external connecting member formed on the pad electrode of the semiconductor chip. When the solder bump electrode is used, when the semiconductor chip is mounted on the mounting substrate, the position of the pad electrode provided on the semiconductor chip and the position of the pad electrode of the mounting substrate must be accurately matched. Therefore, a high precision substrate is required, and the substrate is expensive. Further, in order to form the solder bump electrode on the semiconductor chip, re-wiring process and the solder bump electrode forming process are required after the pad electrode is formed, so that the formation of the solder bump electrode is expensive. Therefore, the use of the wire bonding WB as the external connecting member is advantageous in that it is less expensive than the solder bump electrode.

The thickness of the conductive film PF1 is, for example, 1 μm or more and 2 μm or less. The thickness of the conductive film PF2 is, for example, 1 μm or more and 2 μm or less. The thickness of the conductive film PF3 is, for example, 100 nm or more and 200 nm or less.

On the side surface of the conductive film PF1, an oxide layer OX1 formed by oxidizing the material contained in the conductive film PF1 is formed. The oxide layer OX1 covers the entire side surface of the conductive film PF1. Therefore, the conductive film PF1 is surrounded by the oxide layer OX1, the conductive film PF2, and the barrier metal film BM3, and is not exposed.

When the conductive film PF1 is made of copper as a main component, the oxide layer OX1 is copper oxide as CuO or $CuO_2$ and has an insulating property. A width of the oxide layer OX1 is 200 nm or more, for example, 200 nm or more and 400 nm or less. In the present specification, the term "width" means a length (thickness) in a direction perpendicular to the thickness direction.

Further, as shown in FIG. 1, the plurality of conductive layers OPM are next to each other, but the space between the conductive layers OPM in the first embodiment is 10 μm or less and about 5 μm.

Figure 11:
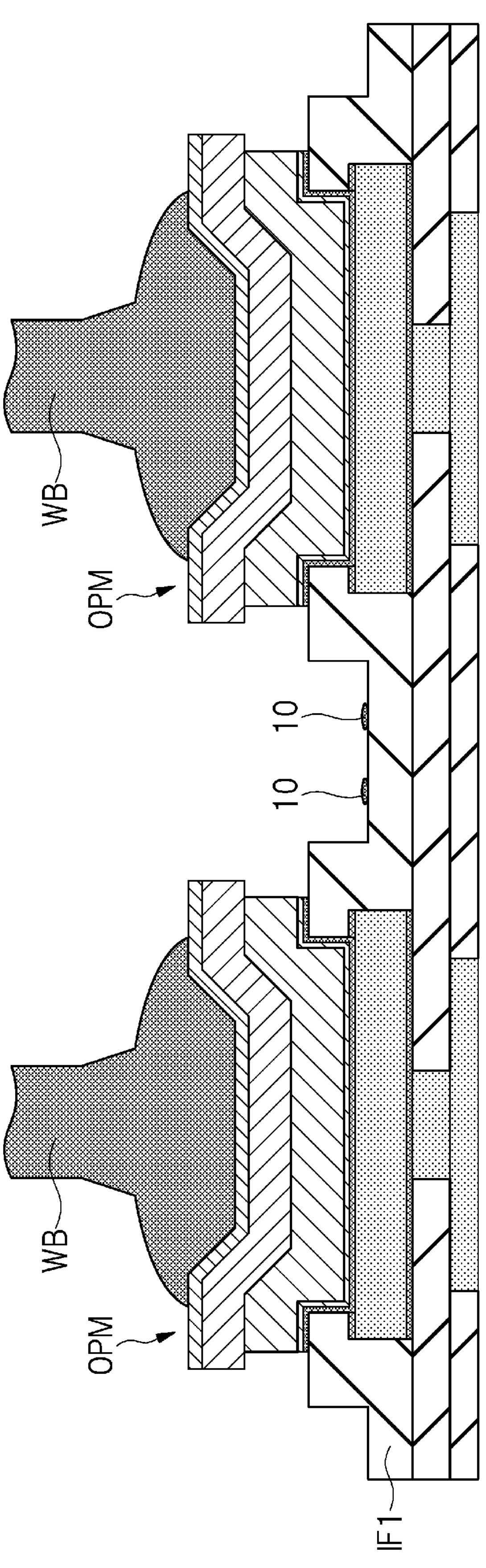
FIG. 11 is a cross-sectional view showing a manufacturing process of the semiconductor device in the examined example.

The main feature of the first embodiment is that the oxide layer OX1 is formed on the side surface of the conductive film PF1, and the advantages of this feature will be detailed later with reference to the examined example (FIG. 11).

Figure 3:
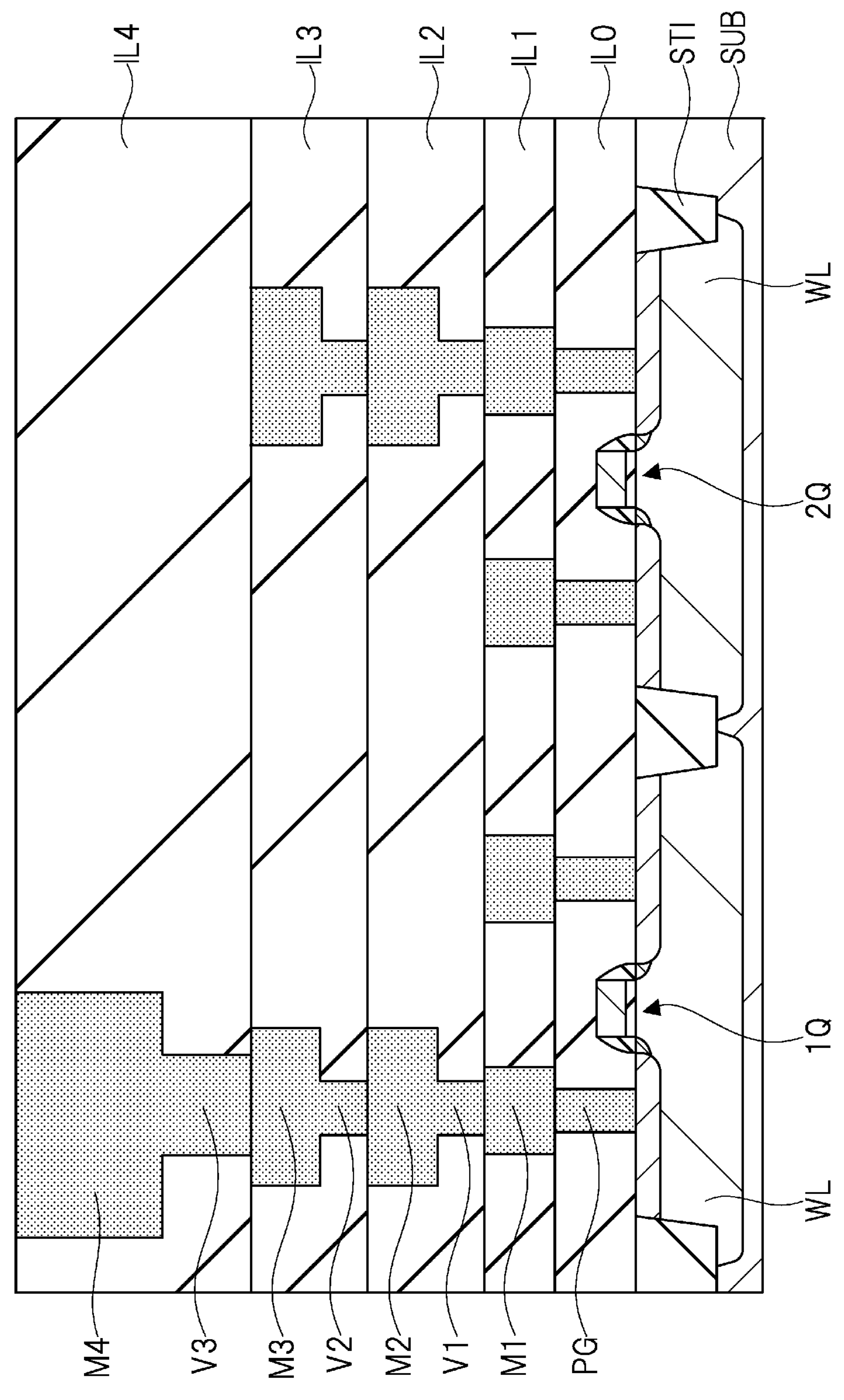
FIG. 3 is a cross-sectional view showing a manufacturing process of the semiconductor device in the first embodiment.

The manufacturing method of the semiconductor device 100 in the first embodiment will be described below with reference to FIG. 3 to FIG. 10. FIG. 3 is a cross-sectional view showing a fourth wiring M4 and its underlying structure. FIG. 4 to FIG. 10 are cross-sectional views showing a fourth wiring M4 and an upper layer structure. In addition, although the multilayer wiring layer is formed of five wiring layers, the number of wiring layers may be less than five layers or more than five layers.

First, as shown in FIG. 3, the semiconductor substrate SUB made of p-type monocrystalline silicon or the like is prepared. At this stage, the semiconductor substrate SUB is in the wafer state. Next, a plurality of element isolation regions STI defining active regions are formed in the semiconductor substrate SUB. The element isolation region STI can be formed by forming a trench in the semiconductor substrate SUB and burying a dielectric film mainly made of, for example, silicon oxide in the trench.

Next, impurities are implanted into the semiconductor substrate SUB to form the well region WL. Next, a gate electrode formed on the well region WL via a gate dielectric film, and a MISFET 1Q and a MISFET 2Q including source/drain regions formed in the well region WL are respectively formed.

Next, an interlayer dielectric film IL0 is formed on the semiconductor substrate SUB by, for example, a CVD method so as to cover the MISFET 1Q and the MISFET 2Q. The interlayer dielectric film IL0 is, for example, a silicon oxide film. Next, a contact hole is formed in the interlayer dielectric film IL0 by a photolithography technique and a dry etching method. Next, a metal film made of, for example, tungsten is buried in the contact hole to form a plug PG. The plug PG is connected to the MISFET 1Q, the MISFET 2Q, or the like.

Next, an interlayer dielectric film IL1 is formed on the interlayer dielectric film IL0 by, for example, a CVD method. The interlayer dielectric film IL1 is formed of a material having a lower dielectric constant than silicon oxide, and is, for example, a carbon-containing silicon oxide film such as SiOC. The first wiring M1 is formed using a so-called damascene technique. That is, the first wiring M1 is formed by forming a trench in the interlayer dielectric film IL1, burying a conductive film mainly made of copper in the trench, and removing the conductive film formed outside the trench by a CMP (Chemical Mechanical Polishing) method. Note that a barrier metal film that prevents copper from diffusing may be formed between copper and the interlayer dielectric film IL1. The first wiring M1 is connected to the upper surface of the plug PG.

Next, an interlayer dielectric film IL2 is formed on the interlayer dielectric film IL1 by, for example, a CVD method so as to cover the first wiring M1. The interlayer dielectric film IL2 is made of the same material as the interlayer dielectric film IL1. Next, the via V1 and the second wiring M2 are formed by forming a via hole and a trench for wiring in the interlayer dielectric film IL2, burying a copper-based conductive film in the via hole and in the trench for wiring, and removing the conductive film formed outside the via hole and outside the trench for wiring by a CMP method. That is, the via V1 and the second wiring M2 are formed by a dual damascene method, which is a kind of damascene method, and are integrated. Note that a barrier metal film that prevents copper from diffusing may be formed between copper and the interlayer dielectric film IL2. The via V1 is connected to the upper surface of the first wiring M1.

Next, an interlayer dielectric film IL3 is formed on the interlayer dielectric film IL2 by, for example, a CVD method so as to cover the second wiring M2. Next, a via V2 and a third wiring M3 are formed on the interlayer dielectric film IL3 by the same method as in the case where the via V1 and the second wiring M2 are formed. Next, an interlayer dielectric film IL4 is formed on the interlayer dielectric film IL3 by, for example, a CVD method so as to cover the third wiring M3. Next, a via V3 and a fourth wiring M4 are formed in the interlayer dielectric film IL4 by the same method as in the case where the via V1 and the second wiring M2 are formed. The interlayer dielectric film IL3 and the interlayer dielectric film IL4 are the same as the interlayer dielectric film IL2.

Figure 4:
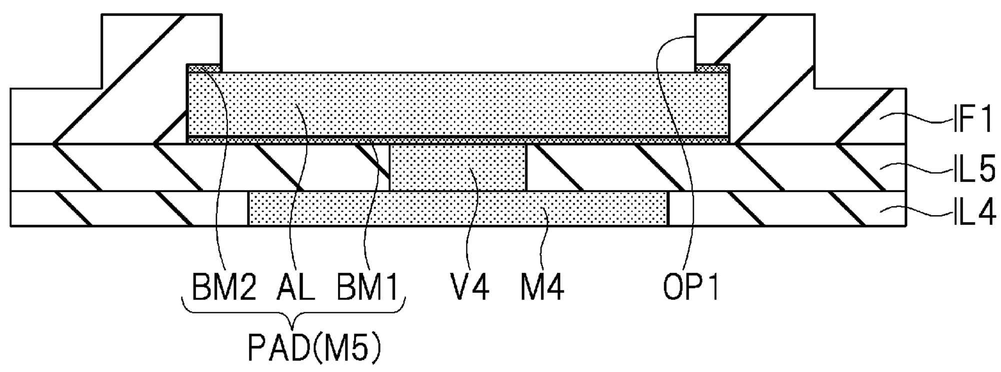
FIG. 4 is a cross-sectional view showing a manufacturing process of the semiconductor device following FIG. 3.

Next, as shown in FIG. 4, an interlayer dielectric film IL5 is formed on the interlayer dielectric film IL4 by, for example, a CVD method so as to cover the fourth wiring M4. The interlayer dielectric film IL5 is, for example, a silicon oxide film or a fluorine-doped silicon oxide film. Next, a via holes is formed in the interlayer dielectric film IL5 by a photolithography technique and a dry etching method. Next, a conductive film containing, for example, tungsten as a main component is buried in the via hole to form a via V4. The via V4 is connected to the upper surface of the fourth wiring M4.

Next, a fifth wiring M5 is formed on the interlayer dielectric film IL5. First, a barrier metal film BM1, a conductive film AL, and a barrier metal film BM2 are sequentially laminated on the interlayer dielectric film IL5 by a CVD method or a sputtering method. Next, the fifth wiring M5 is formed by patterning these films by a photolithography technique and a dry etching method. The fifth wiring M5 is a plurality of wirings formed in the uppermost layer of the multilayer wiring layer, and a part of the wirings is a pad electrode. The fifth wiring M5 (pad electrode PAD) is connected to the upper surface of the via V4.

Next, a dielectric film IF1 is formed on the interlayer dielectric film IL5 by a CVD method so as to cover the fifth wiring M5 (pad electrode PAD). Next, an opening portion OP1 is formed in the dielectric film IF1 by a photolithography technique and a dry etching method so as to reach the pad electrode PAD. Thereafter, the barrier metal film BM2 located in the opening portion OP1 is removed. As a result, the conductive film AL is exposed in the opening portion OP1.

Through the above manufacturing process, the multilayer wiring layer including the semiconductor substrate SUB, the MISFETs 1Q, 2Q, and the pad electrode PAD, and the dielectric film IF1 formed so as to cover the pad electrode PAD are prepared.

Figure 5:
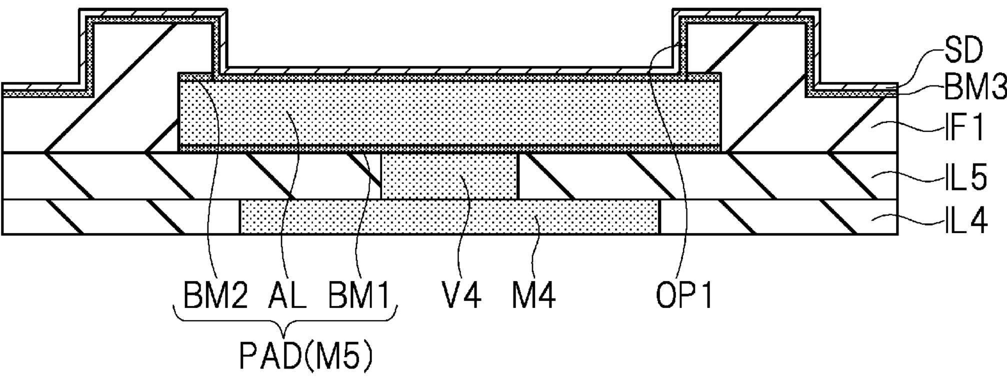
FIG. 5 is a cross-sectional view showing a manufacturing process of the semiconductor device following FIG. 4.

Next, as shown in FIG. 5, a barrier metal film BM3 is formed on the dielectric film IF1 and in the opening portion OP1 by, for example, a CVD method or a sputtering method. The thickness of the barrier metal film BM3 is, for example, 50 nm or more and 200 nm or less. Next, a seed layer SD is formed on the barrier metal film BM3 by, for example, a sputtering method. The seed layer SD is made of the same material as the conductive film PF1 described later, and is made of, for example, a copper-based material. The thickness of the seed layer SD is, for example, 100 nm or more and 300 nm or less.

Figure 6:
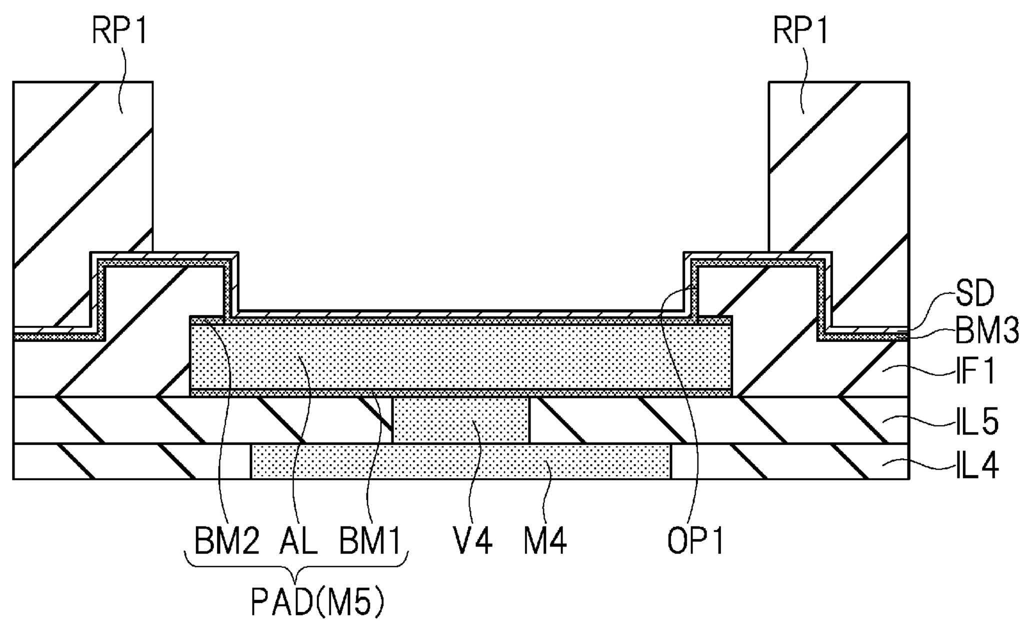
FIG. 6 is a cross-sectional view showing a manufacturing process of the semiconductor device following FIG. 5.

Next, as shown in FIG. 6, a resist pattern RP1 having a pattern opening the region in which the conductive layer OPM is to be formed is formed on the seed layer SD.

Figure 7:
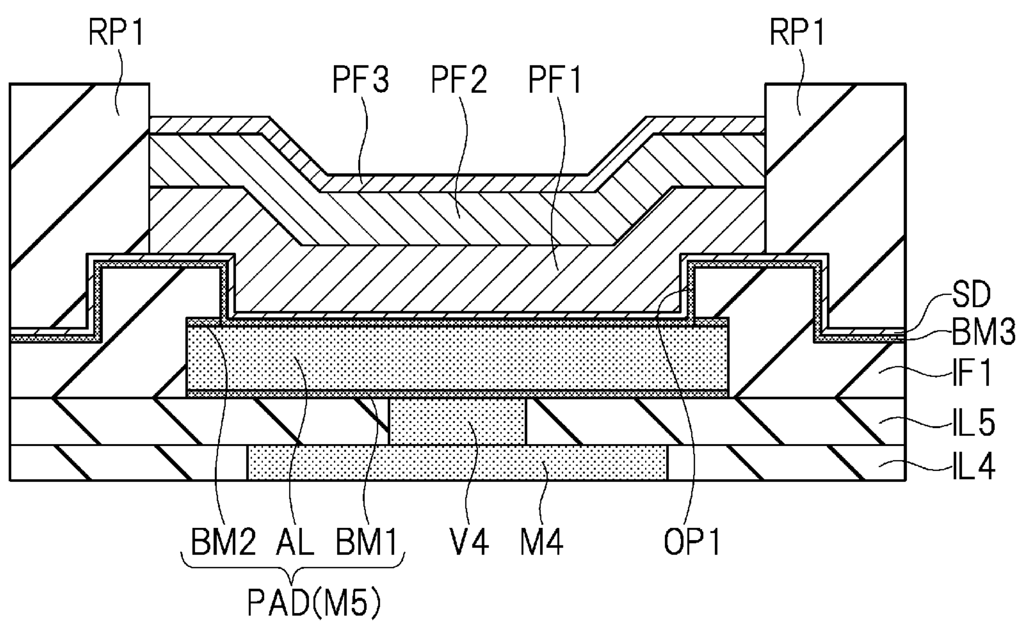
FIG. 7 is a cross-sectional view showing a manufacturing process of the semiconductor device following FIG. 6.

Next, as shown in FIG. 7, a conductive film PF1 is formed on the pad electrode PAD in the opening portion OP1 by a plating method. The conductive film PF1 is formed on the seed layer SD exposed from the resist pattern RP1. Note that, although the seed layer SD located directly below the conductive film PF1 is incorporated into and integrated with the conductive film PF1, the seed layer SD is separately shown here for ease of understanding. Next, a conductive film PF2 is formed on the conductive film PF1 by a plating method. Next, a conductive film PF3 is formed on the conductive film PF2 by a plating method.

Figure 8:
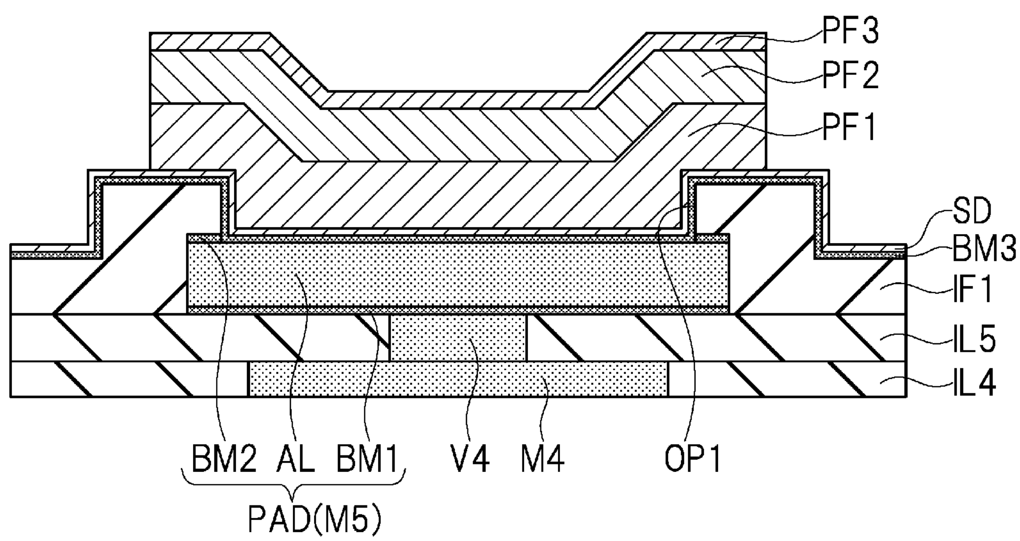
FIG. 8 is a cross-sectional view showing a manufacturing process of the semiconductor device following FIG. 7.

Next, as shown in FIG. 8, the resist pattern RP1 is removed by an ashing process.

Figure 9:
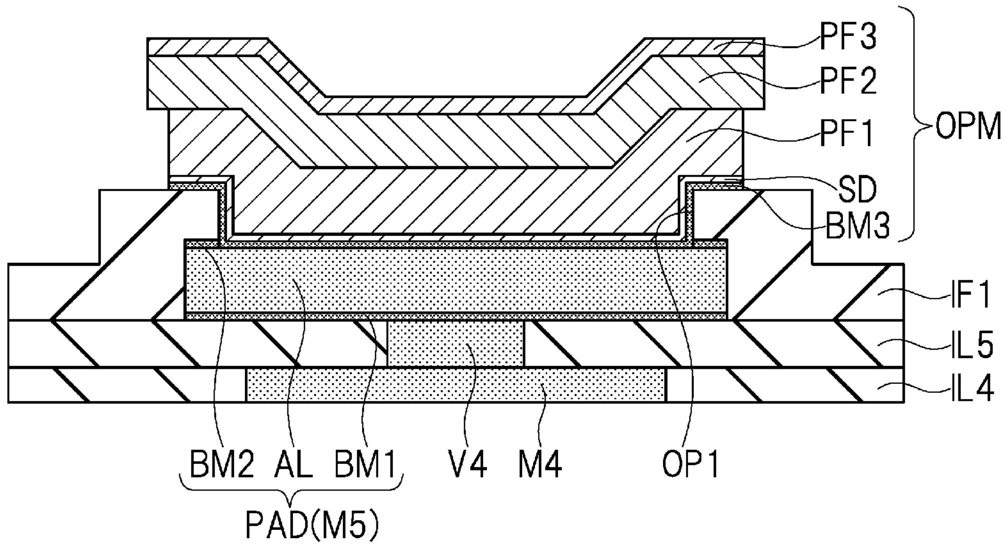
FIG. 9 is a cross-sectional view showing a manufacturing process of the semiconductor device following FIG. 8.

Next, as shown in FIG. 9, in a region exposed from the conductive films PF1 to PF3 (a region where the conductive films PF1 to PF3 are not formed), the seed layer SD and the barrier metal film BM3 are sequentially removed by a wet etching process. Thus, the conductive film OPM is formed.

In addition, the wet etching process is performed so as to be over-etched in order to reliably remove the seed layer SD and the barrier metal film BM3. The side surface of the conductive film PF1 is also etched because the conductive film PF1 is made of the same material as the seed layer SD. Therefore, the side surface of the conductive film PF1 is retracted from the side surface of each of the conductive films PF2, PF3.

Figure 10:
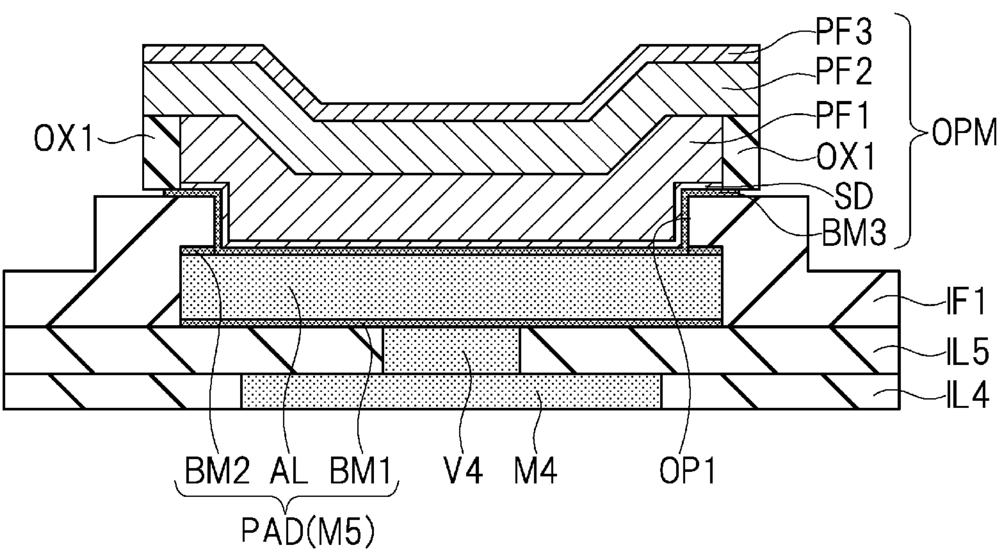
FIG. 10 is a cross-sectional view showing a manufacturing process of the semiconductor device following FIG. 9.

Next, as shown in FIG. 10, by performing an oxidation treatment to the conductive film PF1, an oxide layer OX1 in which the material contained in the conductive film PF1 is oxidized is formed on the side surface of the conductive film PF1. The oxide layer OX1 is, for example, copper oxide such as CuO or $CuO_2$, and has an insulating property. A width of the oxide layer OX1 is 200 nm or more, for example, 200 nm or more and 400 nm or less.

The oxidation treatment is a heat treatment performed in an oxygen atmosphere and performed under conditions of 100° C. or higher and 450° C. or lower. The oxidation treatment may be an oxygen plasma treatment performed under conditions of 100° C. or higher and 250° C. or lower.

Further, since the volume expansion of the oxide layer OX1 occurs by the oxidation treatment, the side surface of the conductive film PF1 including the oxide layer OX1 approaches the side surface of each of the conductive films PF2, PF3. Here, each side surface of the conductive films PF1 to PF3 is substantially at the same position and flush with each other.

However, by further increasing the wet etching process time, the side surface of the conductive film PF1 may be further retracted, and finally, the side surface of the conductive film PF1 including the oxide layer OX1 may be retracted from the side surface of each of the conductive films PF2, PF3. That is, the side surface of the oxide layer OX1 is located inside the respective side surfaces of the conductive films PF2, PF3. In other words, each side surface of the conductive films PF2, PF3 protrudes from the side surface of the oxide layer OX1. The sum of the width of the oxide layer OX1 and the width of the conductive film PF1 (the width of the conductive film PF1 including the oxide layer OX1) is smaller than the width of each of the conductive films PF2, PF3. Here, the side surface of the oxide layer OX1 means a side surface of the oxide layer OX1 that is opposed to the conductive film PF1. In that case, since the distance between the conductive films PF1 next to each other is increased, it is effective that the leakage current is hardly generated.

Thereafter, the semiconductor device 100 shown in FIG. 2 is manufactured through the following manufacturing process. First, the semiconductor substrate SUB is singulated into a plurality of semiconductor chips by performing a dicing process or the like on the wafer-state semiconductor substrate SUB. Next, an external connecting member such as a wire bonding WB is connected to the conductive layer OPM.

Semiconductor Device of Examined Example

The semiconductor device of the examined example studied by the inventors of the present application will be described below with reference to FIG. 11.

In FIG. 11, two conductive layers OPM (two pad electrodes PAD) next to each other are shown. As shown in FIG. 11, in the semiconductor device of the examined example, the conductive film PF1 is not subjected to an oxidation treatment, and the oxide layer OX1 is not formed on the side surface of the conductive film PF1.

Here, in the wet etching process for removing the seed layer SD and the barrier metal film BM3, these may not be completely removed, and may be left as a residue 10 on the dielectric film IF1. When the residue 10 is on the dielectric film IF1, the residue 10 functions as a leak path, and the insulating property between the conductive layers OPM is deteriorated, so that a leak current is likely to be generated.

Further, although the used etching solution is discharged after the wet etching process, the copper constituting the seed layer SD may ionize and dissolve in the etching solution. During the discharge of the etching solution, the ionized copper may be redeposited on the dielectric film IF1. Since the copper redeposited in this way also functions in the same manner as the residue 10, a leakage current is likely to be generated between the conductive layers OPM.

In some of the plurality of conductive layers OPM, a large current flows in the conductive layer OPM. Therefore, deformation of the conductive film PF1 may occur due to electromigration. Then, the deformed conductive film PF1 may approach the next conductive layer OPM and may function as a leak path.

If the space between the conductive layers OPM is large, the above-described problem is unlikely to occur. However, with the promotion of miniaturization in recent years, a space between the pad electrodes PAD is required to be reduced, and a space between the conductive layers OPM is required to be reduced. For example, conventionally, the space between the conductive layer OPM is 20 μm or more, but in recent years, the space between the conductive layers OPM may be 10 μm or less and 5 μm or less. Therefore, the above-described problem is likely to occur.

Main Features of First Embodiment

In the first embodiment, an oxidation treatment is performed on the conductive film PF1, and the oxide layer OX1 is formed on the side surface of the conductive film PF1. The conductive film PF1 is surrounded by the oxide layer OX1, the conductive film PF2, and the barrier metal film BM3, and is not exposed. The oxide layer OX1 is copper oxide such as CuO or $CuO_2$, and is a film having higher resistivity than the conductive film PF1 (copper). Deformation of the conductive film PF1 due to electromigration is easily suppressed by covering the side surface of the conductive film PF1 with the oxide layer OX1.

Further, even when the residue 10 remains on the dielectric film IF1 and when the redeposition of copper occurs on the dielectric film IF1, not only the side surface of the conductive film PF1 but also the residue 10 and the redeposited product are oxidized by the oxidation treatment. That is, the residue 10 and the redeposited material are also high-resistance films. Therefore, a decrease in the insulating property between the conductive layers OPM can be suppressed, and generation of a leakage current can be suppressed, so that the reliability of the semiconductor device 100 can be improved.

When the semiconductor device of the examined example is left in an atmosphere, the conductive film PF1 reacts with oxygen in the atmosphere and is oxidized, and a natural oxide film may be formed on the side surface of the conductive film PF1. Although the thickness of the natural oxide film is, for example, 10 nm or less, it is difficult to suppress the deformation of the conductive film PF1 due to electromigration in such a thin natural oxide film, it is also difficult to suppress generation of a leakage current, it has been clarified by studies of the present inventor. Furthermore, the residue 10 and the redeposited material on the dielectric film IF1 cannot be sufficiently oxidized.

In the first embodiment, by positively oxidizing the side surface of the conductive film PF1, the width of the oxide layer OX1 is 200 nm or more, so that the above-described problems can be solved.

Second Embodiment

Figure 12:
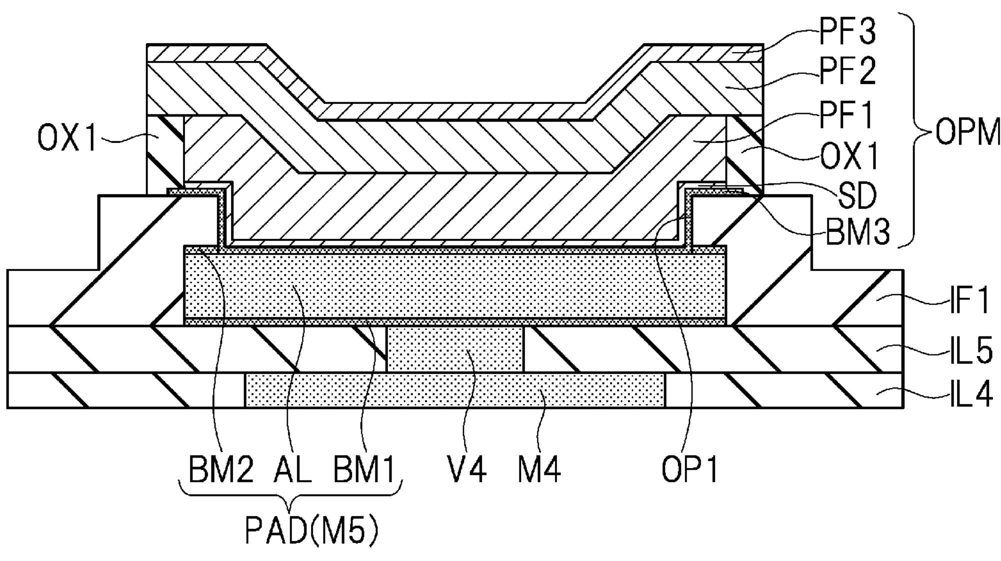
FIG. 12 is a cross-sectional view showing the semiconductor device in the second embodiment.

The semiconductor device in the second embodiment will be described below with reference to FIG. 12. Note that, in the following description, differences from the first embodiment will be mainly described, and the description of overlapping points with the first embodiment will be omitted.

In the second embodiment, the oxide layer OX1 is in contact with the dielectric film IF1. That is, the oxide layer OX1 covers not only the side surface of the conductive film PF1 but also the side surface of the barrier metal film BM3. Such an oxide layer OX1 can be formed by adjusting the oxidation treatment time and increasing the volume expansion of the oxide layer OX1.

When the change of the conductive film PF1 is very large due to the electromigration, the oxide layer OX1 may be peeled off due to stresses from the conductive film PF1. Here, since the adhesion of the oxide layer OX1 can be increased by the oxide layer OX1 being in contact with the dielectric film IF1, the peeling of the oxide layer OX1 is easily suppressed. Therefore, the reliability of the semiconductor device 100 can be further improved.

Third Embodiment

Figure 13:
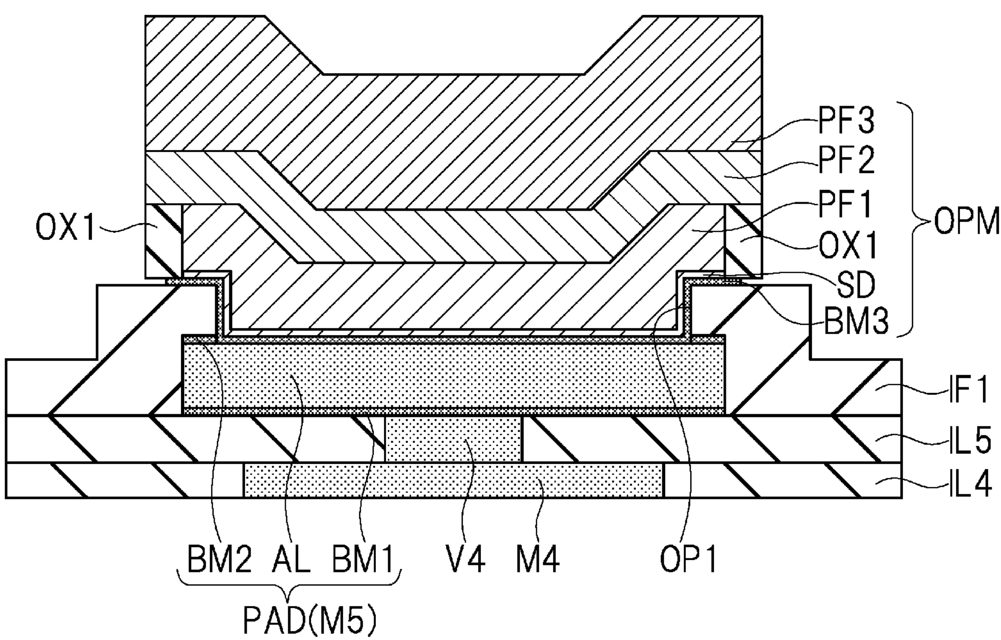
FIG. 13 is a cross-sectional view showing the semiconductor device in the third embodiment.

The semiconductor device in the third embodiment will be described below with reference to FIG. 13. Note that, in the following description, differences from the first embodiment will be mainly described, and the description of overlapping points with the first embodiment will be omitted.

In the first embodiment, the thickness of the conductive film PF3 is smaller than the thickness of each of the conductive film PF1 and the conductive film PF2. In the third embodiment, the thickness of the conductive film PF3 is greater than the thickness of each of the conductive film PF1 and the conductive film PF2, and is, for example, 2 μm or more and 4 μm or less.

When the wire bonding WB is connected to the conductive layer OPM, the conductive layer OPM is subjected to a large pressure. As a result, the conductive film PF1 may be deformed, and the side surface of the conductive film PF1 covered with the oxide layer OX1 may be exposed. In addition, a crack may occur in the dielectric film IF1 due to an impact when the conductive film PF1 is deformed.

Therefore, the thickness of the conductive film PF3 made of the softest material in the conductive layer OPM is increased in order to absorb the pressure at the time of forming the wire bonding WB. That is, the thickness of the conductive film PF3 having the smallest Vickers hardness among the conductive layer OPM is increased. Thus, the above-described problem can be solved.

When the conductive film PF3 is made of a material containing gold as a main component, the Vickers hardness of the conductive film PF3 is 70 HV or less. When the conductive film PF2 is made of a nickel-based material, the Vickers hardness of the conductive film PF2 is 400 HV or more and 500 HV or less. When the conductive film PF1 is made of copper-based material, the Vickers hardness of the conductive film PF1 is 80 HV or more and 200 HV or less.

The technique disclosed in the second embodiment can also be applied to the third embodiment.

Fourth Embodiment

The semiconductor device in the fourth embodiment will be described below with reference to FIG. 14. Note that, in the following description, differences from the first embodiment will be mainly described, and the description of overlapping points with the first embodiment will be omitted.

In the first embodiment, the conductive layer OPM has an OPM structure, whereas in the fourth embodiment, the conductive layer OPM has a Cu pillar structure. In addition, the semiconductor device 100 in the fourth embodiment is a semiconductor module including the mounting substrate 20.

Figure 14:
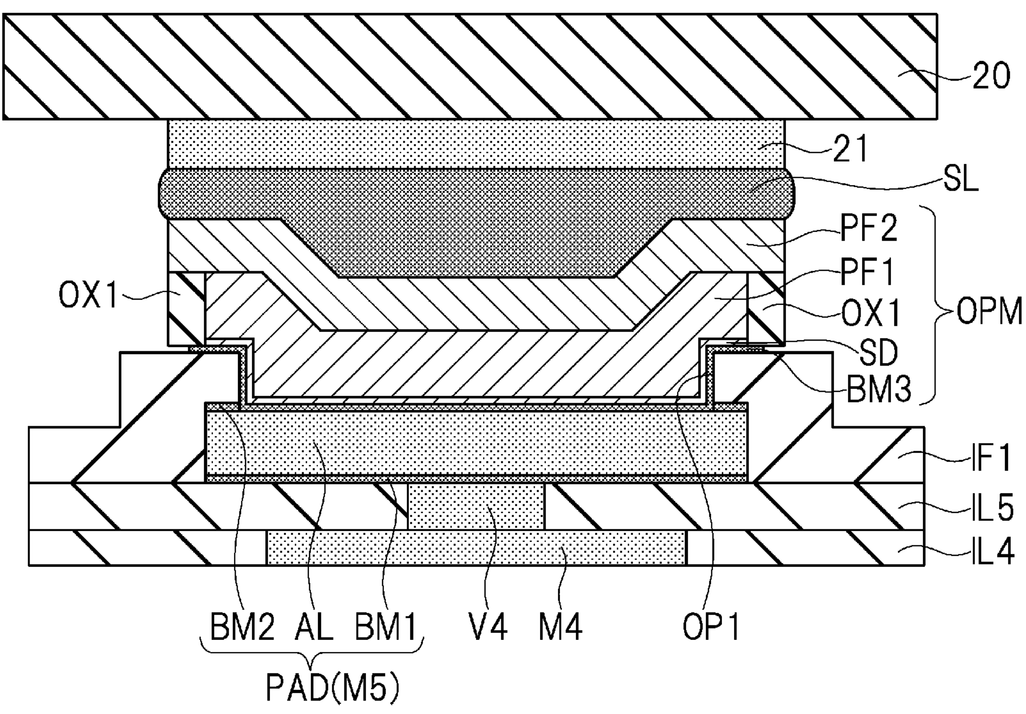
FIG. 14 is a cross-sectional view showing the semiconductor device in the fourth embodiment.

As shown in FIG. 14, the conductive layer OPM in the fourth embodiment includes a barrier metal film BM3, a seed layer SD, a conductive film PF1, and a conductive film PF2. The mounting substrate 20 includes a plurality of wirings including a wiring 21. The conductive film PF2 and the wiring 21 are bonded by a solder layer SL.

In the fourth embodiment, as in the first embodiment, the oxide layer OX1 is formed on the side surface of the conductive film PF1. Therefore, even in the fourth embodiment, deformation of the conductive film PF1 due to electromigration can be suppressed, and generation of a leakage current between the conductive layers OPM can be suppressed, so that the reliability of the semiconductor device 100 can be improved.

The technique disclosed in the second embodiment can also be applied to the fourth embodiment.

Modified Example

Figure 15:
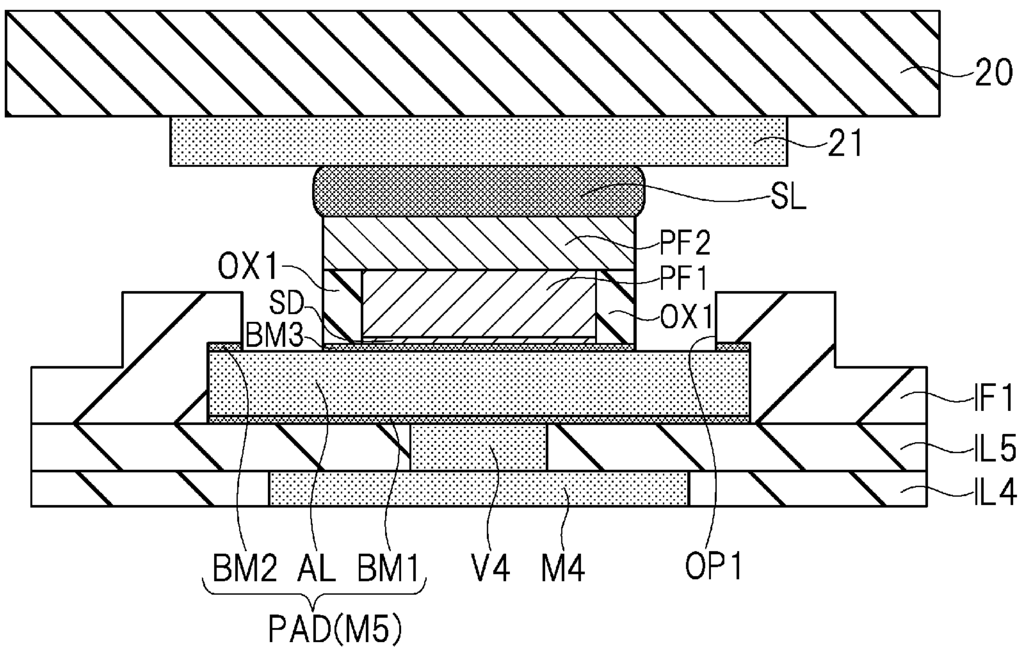
FIG. 15 is a cross-sectional view showing the semiconductor device in the modified example of the fourth embodiment.

FIG. 15 shows the semiconductor device 100 in the modified example of the fourth embodiment. As shown in FIG. 15, the conductive layer OPM in the modified example is formed on the pad electrode PAD in the opening portion OP1 and is not formed on the dielectric film IF1. The conductive layer OPM may be such Cu pillar structure.

Manufacturing Method of Semiconductor Substrate in Fourth Embodiment

The manufacturing method of the semiconductor device 100 in the fourth embodiment will be described below with reference to FIG. 16 to FIG. 21. Hereinafter, Cu pillar structure of FIG. 14 will be described.

Figure 16:
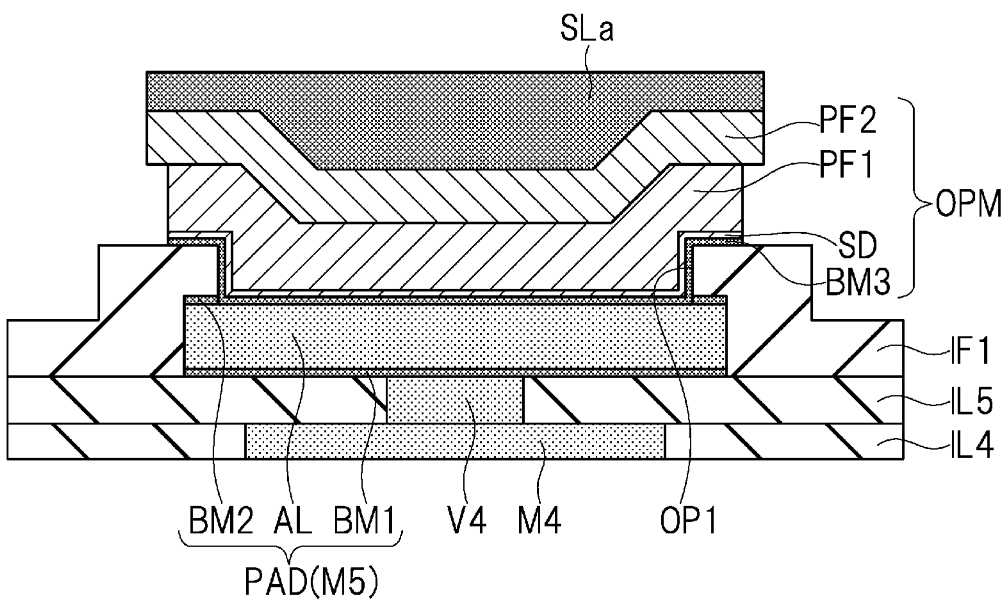
FIG. 16 is a cross-sectional view showing a manufacturing process of the semiconductor device in the fourth embodiment.

The manufacturing process in the fourth embodiment is the same as that in the first embodiment until the conductive film PF2 is formed. Next, as shown in FIG. 16, a solder layer SLa is formed on the conductive film PF2. Next, as shown in FIG. 17, a reflow treatment is performed to the solder layer SLa.

Figure 17:
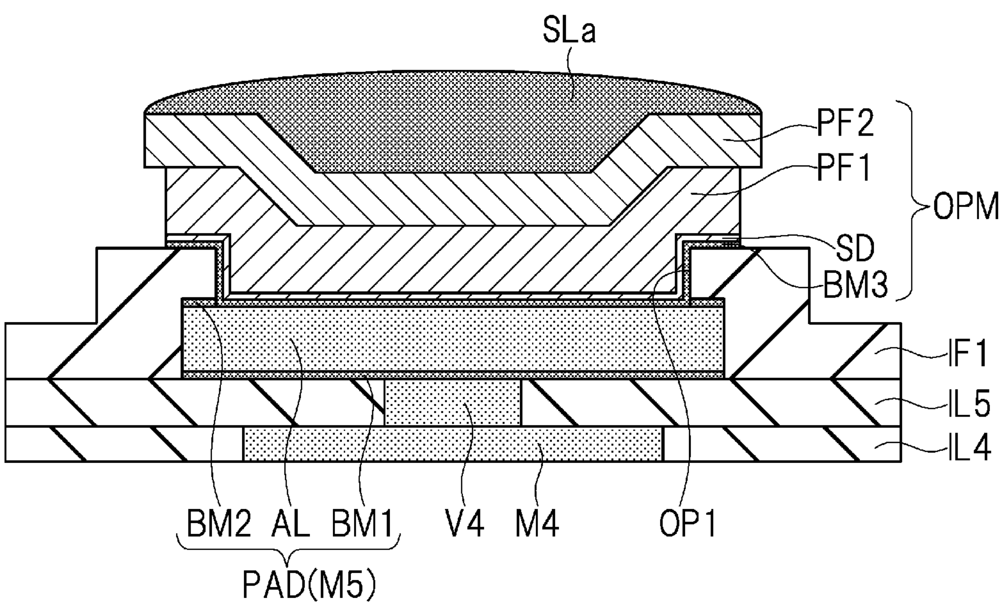
FIG. 17 is a cross-sectional view showing a manufacturing process of the semiconductor device following FIG. 16.
Figure 18:
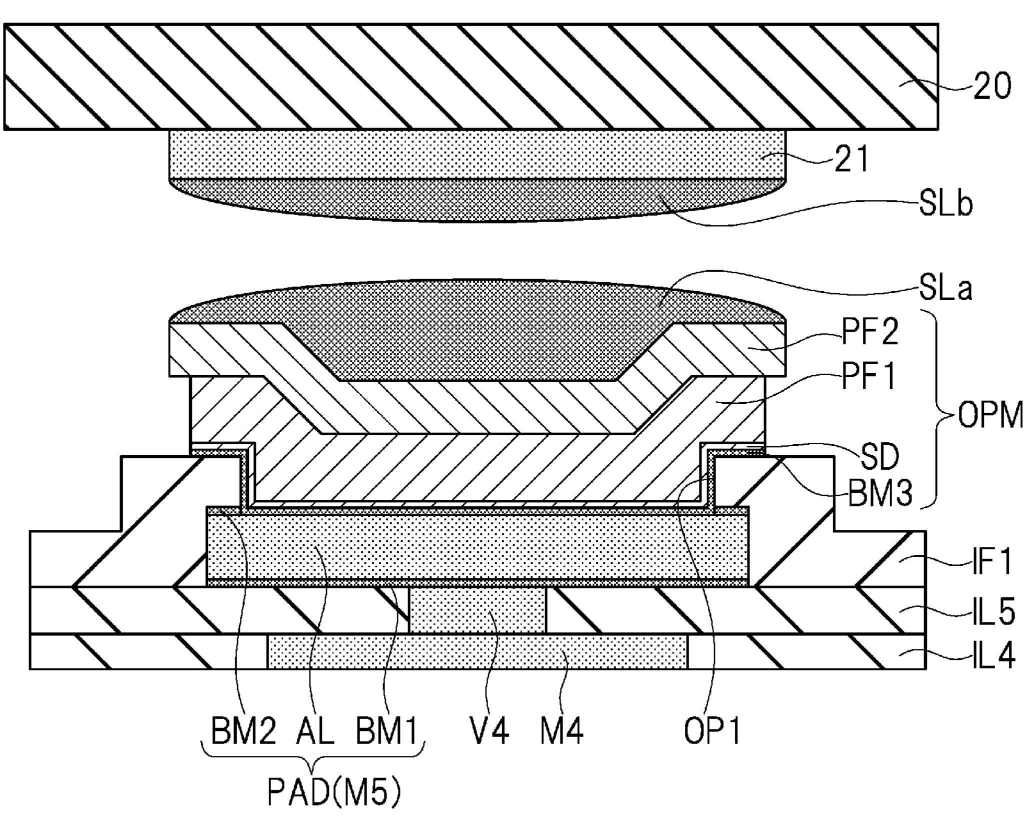
FIG. 18 is a cross-sectional view showing the manufacturing process of semiconductor device following FIG. 17.

Before and after the manufacturing process of FIG. 17, as shown in FIG. 18, a mounting substrate 20 having a solder layer SLb formed on a wiring 21 is prepared. A reflow treatment is also performed to the solder layer SLb. The reflow treatment is performed in an inert gas atmosphere such as nitrogen so that the solder layers SLa, SLb are not oxidized.

Figure 19:
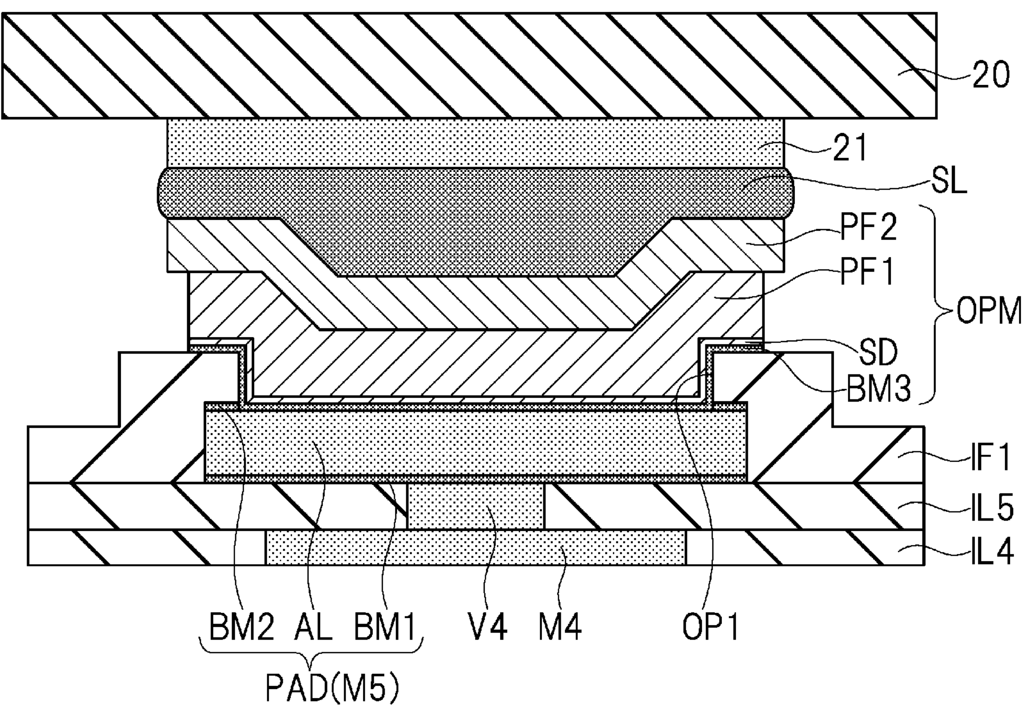
FIG. 19 is a cross-sectional view showing a manufacturing process of the semiconductor device following FIG. 18.

Next, as shown in FIG. 19, the solder layer SLa and the solder layer SLb are bonded to each other. In FIG. 19, the bonded solder layer SLa and the solder layer SLb are shown as the solder layer SL.

Figure 20:
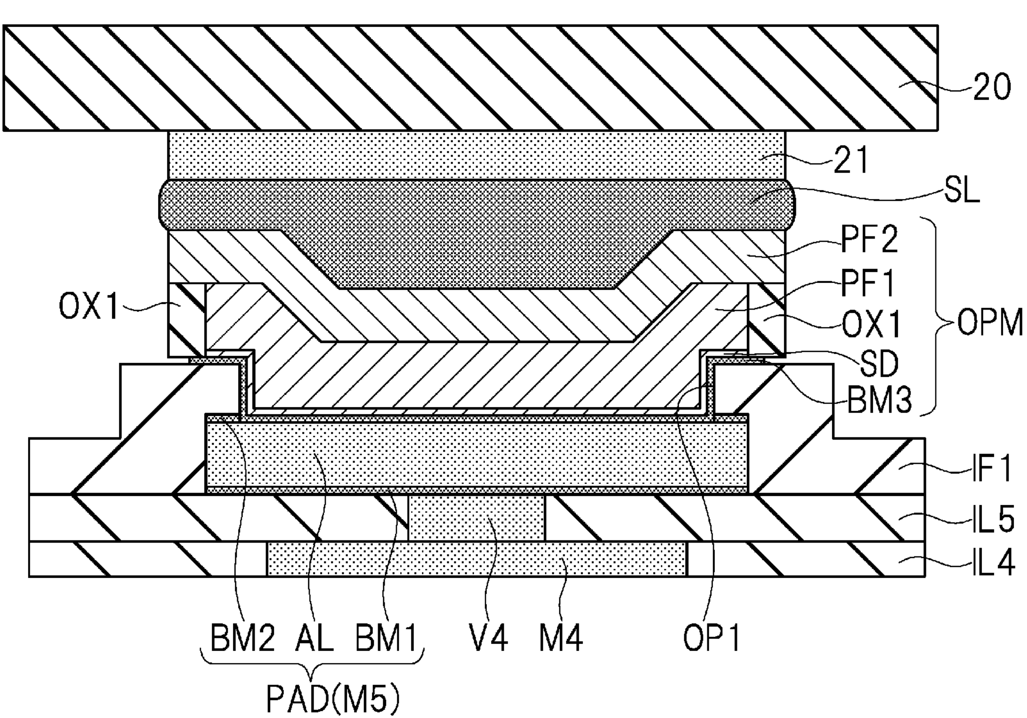
FIG. 20 is a cross-sectional view showing a manufacturing process of the semiconductor device following FIG. 19.

Next, as shown in FIG. 20, by performing an oxidation treatment to the conductive film PF1, the oxide layer OX1 in which the material contained in the conductive film PF1 is oxidized is formed on the side surface of the conductive film PF1. Similar to the first embodiment, the oxide layer OX1 is, for example, copper oxide such as CuO or $CuO_2$, and a width of the oxide layer OX1 is 200 nm or more, for example, 200 nm or more, and 400 nm or less.

The oxidation treatment in the fourth embodiment is performed at a low temperature so that the solder layer SL does not melt. That is, the oxidation treatment in the fourth embodiment is a heat treatment performed in an oxygen atmosphere and performed under conditions of 100° C. or higher and 200° C. or lower. The oxidation treatment may be an oxygen plasma treatment performed under conditions of 100° C. or higher and 200° C. or lower.

Figure 21:
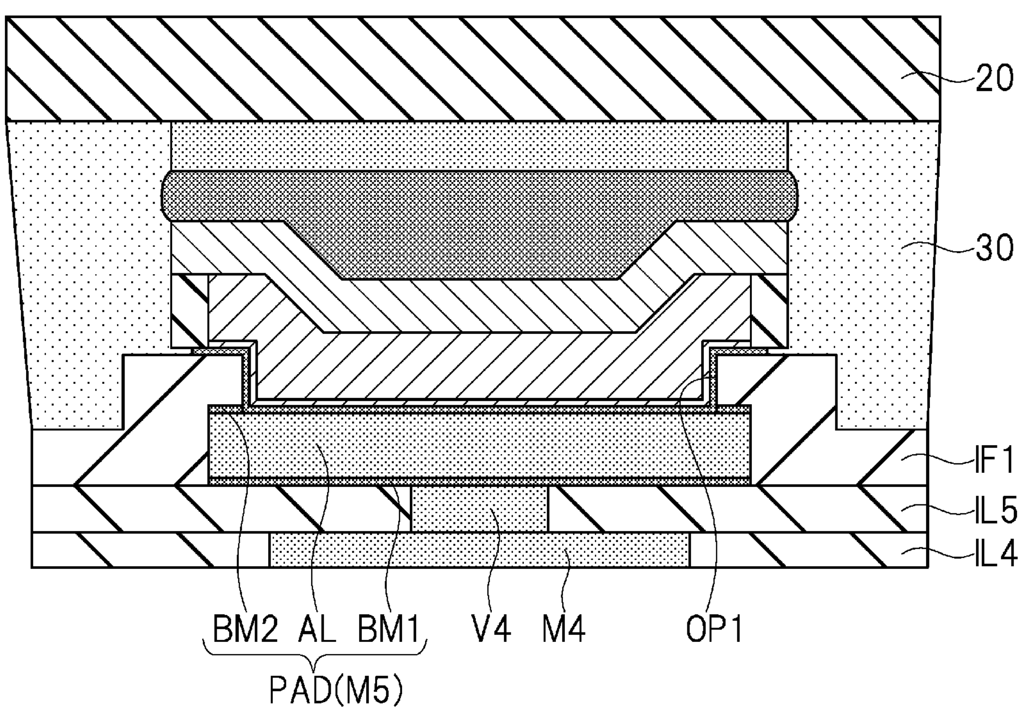
FIG. 21 is a cross-sectional view showing a manufacturing process of the semiconductor device following FIG. 20.

Next, as shown in FIG. 21, a sealing resin 30 is injected between the mounting substrate 20 and the dielectric film IF1, and the conductive layer OPM, the solder layer SL, and the wiring 21 are covered with the sealing resin 30. In this way, the semiconductor device 100 in the fourth embodiment is manufactured.

Although the present invention has been described in detail based on the above-described embodiments, the present invention is not limited to the above-described embodiments, and can be variously modified without departing from the gist thereof.

What is claimed is:

1. A method of manufacturing a semiconductor device, the method comprising:

(a) forming a multilayer wiring layer on a semiconductor substrate;

(b) forming a dielectric film so as to cover a pad electrode formed in an uppermost wiring layer of the multilayer wiring layer;

(c) forming an opening portion in the dielectric film so as to reach the pad electrode;

(d) forming a first conductive film on the pad electrode in the opening portion by a plating method;

(f) after the (d), forming a second conductive film on the first conductive film by a plating method;

(g) after the (f), forming a third conductive film on the second conductive film by a plating method; and (e) after the (g), performing an oxidation treatment to the first conductive film and oxidizing a material contained in the first conductive film, thereby forming an oxide layer on a side surface of the first conductive film, wherein a width of the oxide layer is 200 nm or more, wherein Vickers hardness of the third conductive film is smaller than Vickers hardness of each of the first conductive film and the second conductive film, and wherein a thickness of the third conductive film is thicker than a thickness of each of the first conductive film and the second conductive film.

2. The method according to claim 1, wherein the material contained in the first conductive film is copper, and wherein the oxide layer is copper oxide.

3. The method according to claim 2, wherein the oxidation treatment is a heat treatment performed in an oxygen atmosphere and under conditions of 100° C. or higher and 450° C. or lower, or is an oxygen plasma treatment performed under conditions of 100° C. or higher and 250° C. or lower.

4. The method according to claim 1, wherein in the (c), the first conductive film is formed on the dielectric film, and wherein the oxide layer is in contact with the dielectric film.

5. The method according to claim 1, wherein the material contained in the first conductive film is copper, wherein a material contained in the second conductive film is nickel, wherein a material contained in the third conductive film is gold, and wherein the oxide layer is copper oxide.

6. The method according to claim 1, comprising:

(h) after the (e), connecting a wire bonding to the third conductive film.

7. The method according to claim 1, (i) after the (d) and before the (e), forming a second conductive film on the first conductive film by a plating method;

(j) after the (i) and before the (e), forming a first solder layer on the second conductive film;

(k) preparing a mounting substrate having a first wiring and a second solder layer formed on the first wiring; and (l) after the (j) and the (k) and before the (e), bonding the first solder layer with the second solder layer.

8. The method according to claim 7, wherein the material contained in the first conductive film is copper, wherein the oxide layer is copper oxide, and wherein the oxidation treatment is a heat treatment performed in an oxygen atmosphere and under conditions of 100° C. or higher and 200° C. or lower, or is an oxygen plasma treatment performed under conditions of 100° C. or higher and 200° C. or lower.

9. The method according to claim 1, wherein a side surface of the oxide layer is retracted from a side surface of each of the second conductive film and the third conductive film.

10. The method according to claim 1, comprising:

(m) forming a barrier metal film on the dielectric film and in the opening portion, wherein the oxide layer covers a side surface of the barrier metal film and is in contact with the dielectric film.

* * * * *